United States Patent [19]

Hobrecht

[11] Patent Number: 5,416,442

[45] Date of Patent: May 16, 1995

[54] SLEW RATE ENHANCEMENT CIRCUIT FOR CLASS A AMPLIFIER

[75] Inventor: Stephen W. Hobrecht, Los Altos, Calif.

[73] Assignee: National Semiconductor Corporation, Santa Clara, Calif.

[21] Appl. No.: 205,004

[22] Filed: Mar. 1, 1994

[51] Int. Cl.6 .............................................. H03F 1/38
[52] U.S. Cl. .................................. 330/291; 330/156
[58] Field of Search ............... 330/291, 292, 294, 311, 330/156

[56] References Cited

U.S. PATENT DOCUMENTS 4,484,147 11/1984 Metz ............................ 330/291 X

*Primary Examiner*—Steven Mottola
*Attorney, Agent, or Firm*—Donald H. Nelson; David E. Steuber; Richard J. Roddy

[57] ABSTRACT

An improved Class A amplifier has an enhanced slew rate response at high frequencies. A positive feedback path is connected from the output of the amplifier to a point on the gain path. The feedback path includes a capacitor, a resistor and a transistor, the resistor being connected between the base and emitter of the transistor. At relatively high frequencies, the voltage drop across the resistor causes the transistor to turn on, forming a buffered positive feedback path through an additional resistor. The amount of feedback is controlled by the second resistor in the feedback path. In the preferred embodiment, dual feedback paths are connected between the output terminal and different points in the gain path.

20 Claims, 4 Drawing Sheets 5,416,442

SLEW RATE ENHANCEMENT CIRCUIT FOR CLASS A AMPLIFIER

FIELD OF THE INVENTION

This invention relates to Class A amplifiers and in particular, to an arrangement for increasing the slew rate or bandwidth of a Class A amplifier. The invention is particularly applicable to a driver for a cathode ray tube.

BACKGROUND OF THE INVENTION

The bandwidth of Class A amplifiers is generally limited by parasitic capacitances which are associated with the internal components of the amplifier. This can be illustrated by reference to FIG. 1, which shows a circuit diagram of a conventional Class A amplifier 10. The input signal $V_{IN}$ is applied to the base of a transistor Q1. A resistor RE provides a conversion of input voltage to current, while a transistor Q2 acts as a common base or cascode amplifier stage to drive a load resistor RL. The base of cascode transistor Q2 is coupled to a reference voltage $V_b$. Transistors Q3 and Q4 are emitter-followers which serve to isolate the impedance of resistor RL from the capacitance of the device driven by the amplifier, e.g., a cathode ray tube (CRT). Diodes D1 and D2 provide forward-bias to the output stage to reduce crossover distortion at low signal levels. The low frequency gain of the amplifier is approximately equal to RL/RE. The bandwidth of the amplifier is defined by the collector time constant formed by the load resistor RL and the parasitic capacitance associated with transistors Q2, Q3 and Q4 as well as stray capacitance associated with the circuit layout. These capacitances are represented collectively in FIG. 1 as $C_{p1}$, $C_{p2}$ and $C_{p3}$.

A known technique used to increase the output power of power amplifiers is to connect a "bootstrap" capacitor between the output and the load resistor. This capacitor provides a source of base current to the emitter-follower (e.g., transistor Q4 in FIG. 1) when the amplifier is slewing in a positive direction. This increases the small-signal bandwidth of the output stage and makes the load resistor look more like a current source, thereby sharply increasing the slew rate.

Such a technique is not practical with a high-frequency amplifier fabricated on an integrated circuit (IC), because a relatively large capacitance would be required and this would significantly increase the size of the IC.

SUMMARY OF THE INVENTION

In an arrangement according to this invention, the bandwidth of a Class A amplifier is significantly increased without the use of an unduly large capacitor. A feedback conductive path is connected between an output of the amplifier and a location on a "gain" path (i.e., a current path which includes a load). The feedback path includes a switching transistor and a first resistor, the first resistor being connected between an input terminal and another terminal of the transistor. The feedback path also includes a capacitor. As the slew rate (dV/dt) of the amplifier increases, the current into the capacitor increases. Since the first resistor is connected in series with the capacitor, the voltage drop across the first resistor likewise increases. When this voltage drop reaches a threshold level (e.g., 0.7 V), the transistor turns on, forming a buffered positive feedback path through a second resistor. The value of the second resistor is adjusted so as to produce the optimal amount of positive feedback, thereby significantly improving the slew rate response of the amplifier.

In a preferred embodiment, the transistor is a bipolar transistor, with the first resistor connected between the base (input) and emitter terminals thereof. The load includes a load resistor similar to resistor RL shown in FIG. 1, but it could also include a current source. Two feedback paths of the kind described above are connected between the output of the amplifier and selected points in the gain path.

DESCRIPTION OF THE INVENTION

Figure 1:
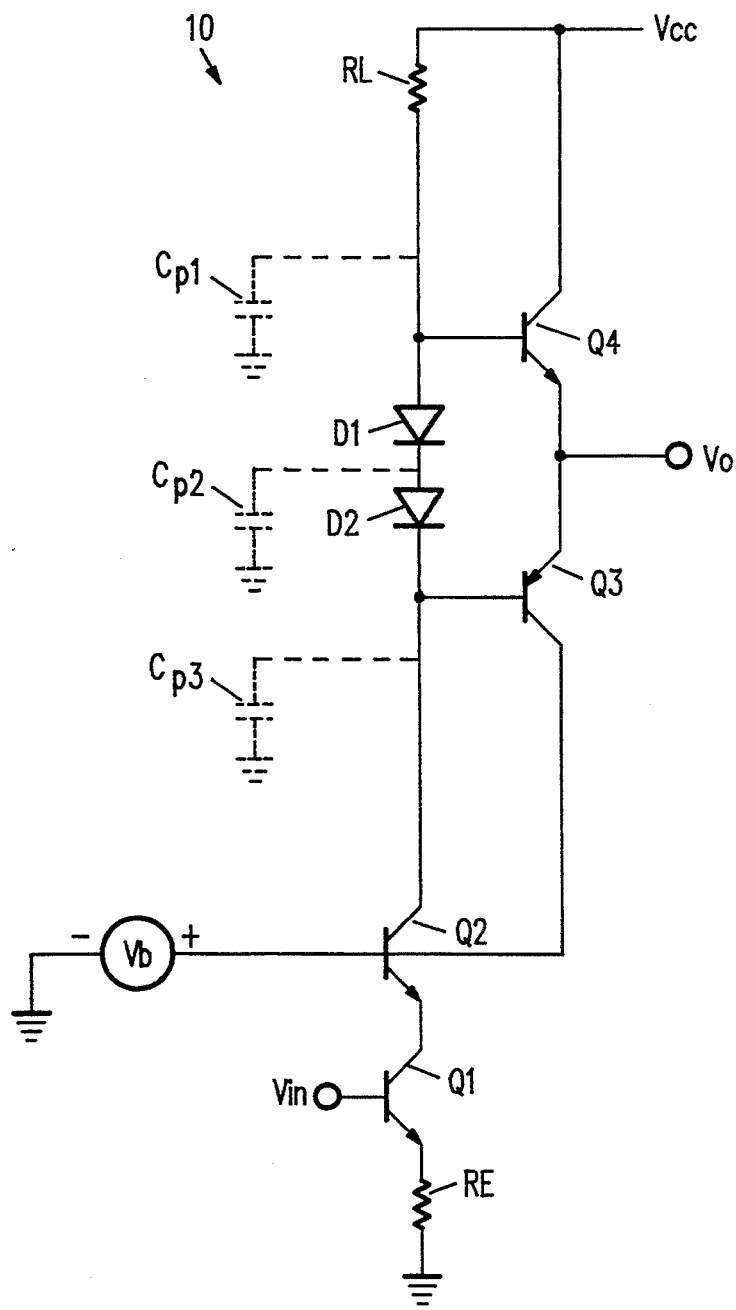
FIG. 1 illustrates a circuit diagram of a conventional Class A amplifier.
Figure 2:
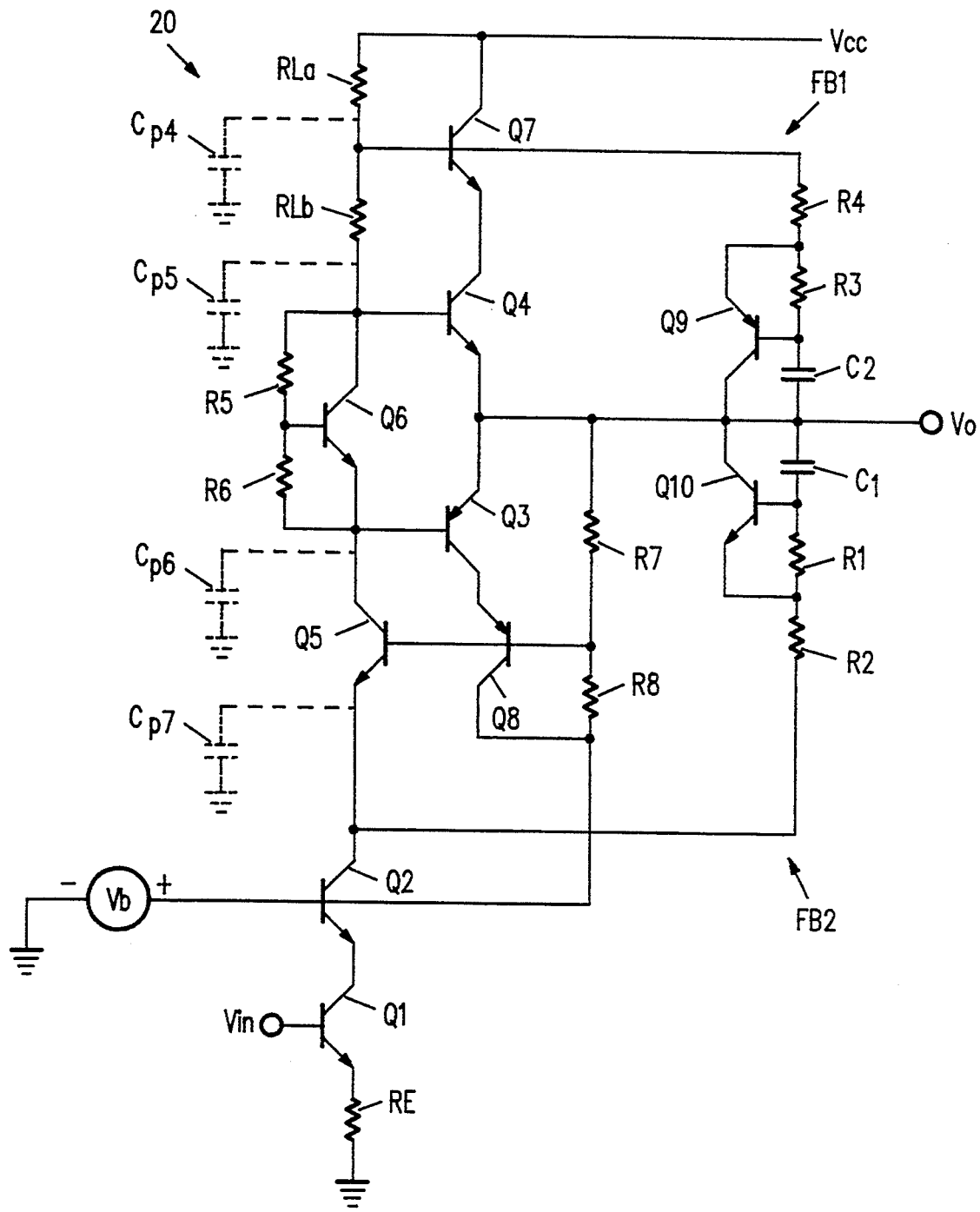
FIG. 2 illustrates a circuit diagram of a Class A amplifier containing circuitry for improving the slew rate response in accordance with this invention.

An amplifier 20 according to the invention is illustrated in FIG. 2. Transistors Q1, Q2, Q3 and Q4 are comparable to the similarly numbered elements described above. The load resistor has been split into two parts, a load resistor RLa and a load resistor RLb. A bias voltage Vb biases the base of cascode transistor Q2. A transistor Q7 is connected in series with transistor Q4 to the positive supply voltage Vcc; and a transistor Q8 is connected in series with transistor Q3 to the bias voltage Vb. Transistors Q7 and Q8 are intended to prevent the breakdown of transistors Q4 and Q3, respectively, as a result of the total voltage drop between $V_{cc}$ and $V_b$. A circuit including a transistor Q6 and resistors R5 and 56 provides forward bias to the output stage to reduce crossover distortion at low signal levels. A voltage divider including resistors R7 and R8 is connected between the bias voltage Vb and the output Vo. The junction between resistors R7 and R8 is connected to the base of transistor Q8 and to the base of a second cascode transistor Q5, which is included in the gain path between transistors Q2 and Q6 to minimize the required breakdown voltage of transistor Q2. The parasitic and stray capacitances which limit the slew rate response of amplifier 20 are designated collectively as $C_{p4}$, $C_{p5}$, $C_{p6}$ and $C_{p7}$.

The gain of amplifier 20 at a low frequency is approximately equal to (RLa+RLb)/RE.

A first feedback path FB1 is connected between the output and the junction of load resistors RLa and RLb. A second feedback path FB2 is connected between the output and the collector of transistor Q2. Feedback path FB1 includes a series arrangement of capacitor C2 and resistors R3 and R4. The emitter of a transistor Q9 is connected to the common junction between resistors R3 and R4, the base of transistor Q9 being connected to the other side of resistor R3. Similarly, feedback path FB2 includes a series arrangement of a capacitor C1 and resistors R1 and R2. The emitter of transistor Q10 is connected to the common junction between resistors R1 and R2 and the base of transistor Q10 is connected to the other side of resistor R1.

Figure 3A:
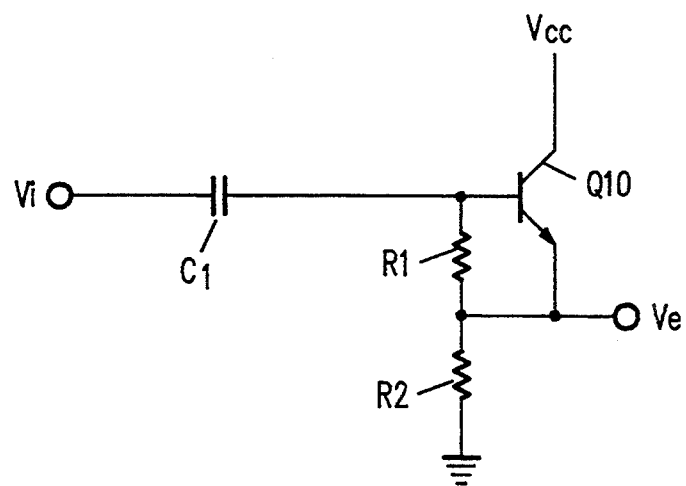
FIG. 3A illustrates a circuit diagram useful in explaining the invention.
Figure 3B:
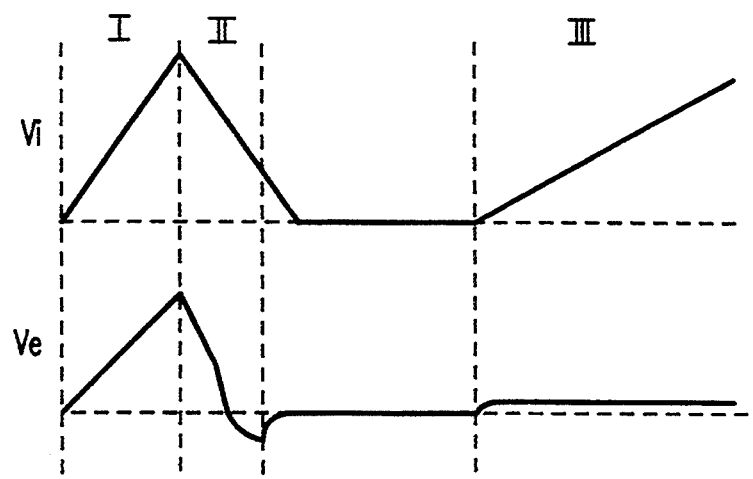
FIG. 3B illustrates input and output voltage curves for the circuit illustrated in FIG. 3A.

The operation of the components in feedback path FB2 may be more easily understood by reference to FIGS. 3A and 3B. FIG. 3A shows a slightly modified arrangement of the elements of feedback path FB2. With transistor Q10 turned off, the current I through resistor R1 can be expressed as follows:

$$I \alpha C \frac{dVi}{dt}$$

As the frequency or slew rate of the input signal Vi increases, dVi/dt also increases. When the current I increases to the point where the voltage drop across resistor R1 is approximately equal to 0.7 V, transistor Q10 turns on. When this happens, a relatively large current flows from the positive supply voltage Vcc through resistor R2 to ground.

The operation of this circuit is illustrated in FIG. 3B. In Zone I, the input voltage Vi is increasing relatively rapidly, and the resulting current through resistor R1 turns transistor Q10 on. In this situation, the output voltage Ve essentially tracks the input voltage Vi. When the input voltage Vi rises relatively slowly; as illustrated in Zone III, transistor Q10 does not turn on, and the output voltage Ve reflects a relatively constant current through resistor R2. The behavior of the circuit in Zone II is marked by an initial period during which transistor Q10 remains on, and Ve essentially tracks Vi, and a later period when transistor Q10 is turned off. When transistor Q10 turns off, the current decays through the R-C network, overshoots the ground potential, and decays in the other direction until ground potential is reached. In this way, the capacitor is discharged and ready for another initiation through region I.

Referring again to FIG. 2, when the rise time (i.e., frequency) of Vo is at a relatively low level, the current in feedback path FB2 flows through capacitor C1 and resistors R1 and R2. The positive feedback applied to the collector of transistor Q2 is relatively attenuated in this regime, and the gain of the amplifier is not significantly affected. When the frequency exceeds a selected level, however, the voltage drop across resistor R1 (which is a function of dVo/dt) becomes sufficiently high that transistor Q10 turns on. In this condition, capacitor C1 and resistor R1 are essentially removed from feedback path FB2, and the feedback current flows only through resistor R2. Transistor Q10 acts as a switch and an output signal buffer providing current through feedback path FB2. This increases the positive feedback applied to the collector of transistor Q2 and significantly increases the discharge rate of the parasitic and stray capacitances, thereby increasing the performance of the amplifier at these higher frequencies. The voltage divider consisting of resistors R7 and R8 ensures that the voltage at the collector of transistor Q2 is approximately equal to one-half of the output voltage.

Similarly, when the rise time of the output voltage Vo exceeds a selected level, the voltage drop across resistor R3 causes transistor Q9 to turn on. This buffers capacitor C2 and increases the amount of positive feedback applied to the junction between load resistor RLa and load resistor RLb.

The level of positive feedback applied when either of transistors Q9 or Q10 are turned on is controlled by adjusting the values of resistors R4 and R2, respectively.

Figure 4:
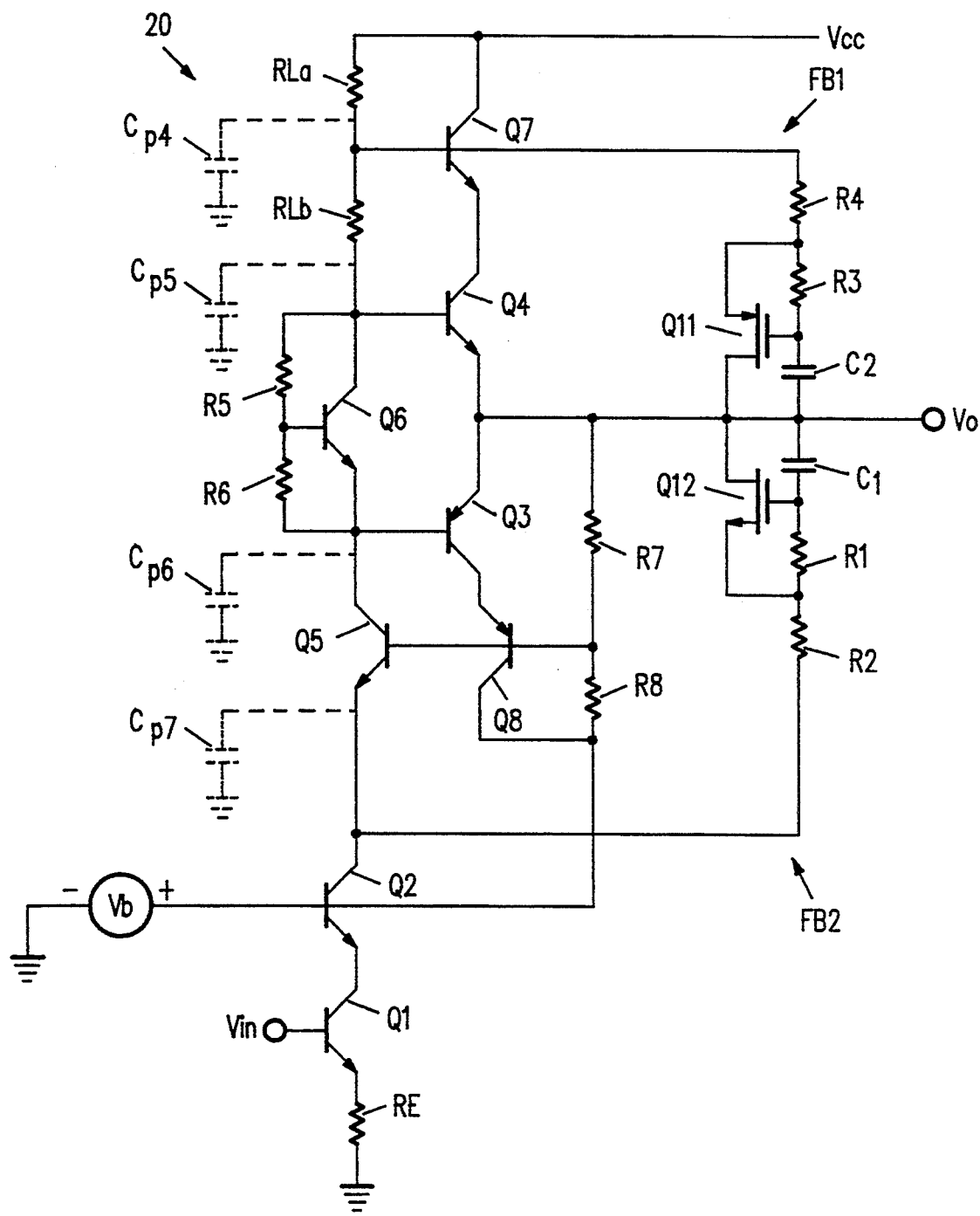
FIG. 4 illustrates a circuit diagram of a class A amplifier containing circuitry for improving the slew rate response in accordance with an alternative embodiment of this invention.

While a specific embodiment according to this invention has been described, it will be understood that numerous alternative embodiments may be constructed in accordance with the broad principles of this invention. For example, while the embodiment described above was fabricated using bipolar technology, it will be apparent to those skilled in the art that CMOS and DMOS technologies could also be used, with MOSFETs being substituted for the bipolar transistors. If a MOSFET Q11 is substituted for transistor Q9 as shown in FIG. 4, resistor R3 would be connected between the gate (input) and source terminals thereof. Moreover, a current source load including, for example, a cascoded transistor (similar to transistor Q5 in FIG. 2) could be substituted for load resistors RLa and RLb. The structure of such current source loads is well known to those skilled in the art.

This invention, as defined in the following claims, is intended to include all such alternatives.

I claim:

1. An amplifier comprising:
    a conductive path extending between a positive voltage supply and a negative voltage supply and comprising a first transistor and a load;
    an input terminal of said amplifier connected to a base terminal of said first transistor, variations of an input voltage at said input terminal of said amplifier producing variations of a voltage drop across said load, said voltage drop across said load being used to produce an output voltage at an output terminal of said amplifier; and
    a feedback path extending between said output terminal and a point on said conductive path, said feedback path including a first resistor and a capacitor connected in series, said first resistor being connected between a base terminal and an emitter terminal of a second transistor.

2. The amplifier of claim 1 wherein said feedback path further comprises a second resistor connected in series with a parallel combination, said parallel combination including said capacitor, said first resistor and said second transistor.

3. The amplifier of claim 2 wherein said load comprises a load resistor.

4. The amplifier of claim 3 wherein said load resistor comprises first and second resistive elements, said feedback path being connected to a point on said conductive path between said first and second resistive elements.

5. The amplifier of claim 2 wherein said load comprises a current source.

6. The amplifier of claim 5 wherein said current source comprises a cascode transistor.

7. The amplifier of claim 1 wherein said amplifier comprises a second feedback path extending between said output terminal and a second point on said conductive path.

8. The amplifier of claim 7 wherein said second feedback path comprises a second resistor and a second capacitor connected in series, said second resistor being connected between a base terminal and an emitter terminal of a third transistor.

9. The amplifier of claim 8 wherein said conductive path comprises a first cascode transistor, said second feedback path being connected to a collector terminal of said first cascode transistor.

10. The amplifier of claim 9 further comprising a second cascode transistor and a voltage divider, said voltage divider being connected between said output of said amplifier and a base terminal of said first cascode transistor.

11. The amplifier of claim 10 wherein an intermediate point of said voltage divider is connected to a base terminal of said second cascode transistor.

12. The amplifier of claim 11 wherein said base terminal of said first cascode transistor is connected to a reference voltage.

13. An amplifier comprising:
a conductive path extending between a positive voltage supply and a negative voltage supply and comprising a first transistor and a load;
an input terminal of said amplifier connected to a gate terminal of said first transistor, variations of an input voltage at said input terminal of said amplifier producing variations of a voltage drop across said load, said voltage drop across said load being used to produce and output voltage at an output terminal of said amplifier; and
a feedback path extending between said output terminal and a point on said conductive path, said feedback path including a first resistor and a capacitor connected in series, said first resistor being connected between a gate terminal and a source terminal of a second transistor.

14. The amplifier of claim 13 wherein said feedback path further comprises a second resistor connected in series with a parallel combination, said parallel combination including said capacitor, said first resistor and said second transistor.

15. The amplifier of claim 13 wherein said amplifier comprises a second feedback path extending between said output terminal and a second point on said conductive path.

16. The amplifier of claim 15 wherein said second feedback path comprises a second resistor and a second capacitor connected in series, said second resistor being connected between a gate terminal an a source terminal of a third transistor.

17. An amplifier comprising:
a conductive path extending between a positive voltage supply and a negative voltage supply and comprising a first transistor and a load;
an input terminal of said amplifier connected to said first transistor, variations of an input voltage at said input terminal of said amplifier producing variations of a voltage drop across said load, said voltage drop across said load being used to produce an output voltage at an output terminal of said amplifier; and
a feedback path extending between said output terminal and a point on said conductive path, said feedback path comprising
a plurality of impedance elements connected in series; and
means to bypass at least one of said plurality of impedance elements, said means being actuated when a slew rate of said output voltage reaches a selected value.

18. The amplifier of claim 17 wherein said plurality of impedance elements comprises resistive and capacitive elements.

19. The amplifier of claim 17 wherein said means to bypass comprises a transistor.

20. The amplifier of claim 19 wherein said transistor is connected to said output terminal.

* * * * *